(12) United States Patent
Marcinno' et al.

(10) Patent No.: US 12,092,659 B2
(45) Date of Patent: Sep. 17, 2024

(54) SAFETY SYSTEM FOR NEEDLE PROBE CARD FOR HIGH-VOLTAGE AND HIGH-CURRENT TEST ON POWER SEMICONDUCTOR DEVICES, RELATED TEST MACHINE AND CORRESPONDING TESTING METHOD

(71) Applicant: CREA COLLAUDI ELETTRONICI AUTOMATIZZATI S.R.L., Cirie' (IT)

(72) Inventors: Marco Marcinno', Cirie' (IT); Carlo Cianferotti, Piombino (IT)

(73) Assignee: CREA COLLAUDI ELETTRONICI AUTOMATIZZATI S.R.L., Cirie' (IT)

(*) Notice: Subject to any disclaimer, the term of this patent is extended or adjusted under 35 U.S.C. 154(b) by 0 days.

(21) Appl. No.: 17/762,762

(22) PCT Filed: May 27, 2021

(86) PCT No.: PCT/IB2021/054645
§ 371 (c)(1),
(2) Date: Mar. 23, 2022

(87) PCT Pub. No.: WO2021/240431
PCT Pub. Date: Dec. 2, 2021

(65) Prior Publication Data
US 2023/0071495 A1    Mar. 9, 2023

(30) Foreign Application Priority Data
May 27, 2020  (IT) .................. 102020000012556

(51) Int. Cl.
*G01R 1/06*    (2006.01)
*G01R 1/067*   (2006.01)
*G01R 1/073*   (2006.01)

(52) U.S. Cl.
CPC ..... *G01R 1/06794* (2013.01); *G01R 1/07385* (2013.01)

(58) Field of Classification Search
CPC ............ G01R 1/06794; G01R 1/07385; G01R 31/2891
See application file for complete search history.

(56) References Cited

U.S. PATENT DOCUMENTS

| 4,780,836 A | 10/1988 | Miyazaki et al. |
| 2002/0074653 A1* | 6/2002 | Khandros ............... H01L 23/50 257/E23.079 |

(Continued)

FOREIGN PATENT DOCUMENTS

| AT | 007587 U1 | 5/2005 |
| AT | 007714 U1 | 7/2005 |

(Continued)

OTHER PUBLICATIONS

International Search Report, issued in PCT/IB2021/054645, mailed Sep. 20, 2021, Rijswijk, NL.

*Primary Examiner* — Jermele M Hollington
*Assistant Examiner* — Taqi R Nasir
(74) *Attorney, Agent, or Firm* — ArentFox Schiff LLP; Michael Fainberg

(57) ABSTRACT

A safety system for a needle probe card for test machines for high-voltage and high-current testing of power semiconductor electronic devices is provided. The needle probe card has a plurality of needles adapted to be placed in contact with a device under test (DUT), each needle being configured to allow a flow of electric current. The safety system has a control unit capable of determining the electric current flowing in every single needle, and a plurality of switching devices configured to selectively interrupt the electric current flowing in the needles. At least one switching device is associated with each needle of the needle probe card. The (Continued)

control unit is configured to drive every single switching device to selectively interrupt the flow of electric current in a corresponding needle.

14 Claims, 4 Drawing Sheets

(56) References Cited

U.S. PATENT DOCUMENTS

| | | | |
|---|---|---|---|
| 2006/0170435 A1 | 8/2006 | Granicher et al. | |
| 2007/0223156 A1 | 9/2007 | Kumagai et al. | |
| 2008/0290882 A1 | 11/2008 | Rogers et al. | |
| 2010/0013503 A1* | 1/2010 | Huebner | G01R 31/31926 |
| | | | 324/757.03 |
| 2010/0327898 A1* | 12/2010 | Ishigaki | G01R 1/07385 |
| | | | 324/756.03 |
| 2014/0029150 A1 | 1/2014 | Fledell et al. | |
| 2015/0226783 A1 | 8/2015 | Kang | |
| 2021/0098314 A1* | 4/2021 | Ebiike | H01L 22/14 |

FOREIGN PATENT DOCUMENTS

| | | |
|---|---|---|
| AT | 14209 U1 | 6/2015 |
| EP | 2924445 A1 | 9/2015 |

\* cited by examiner

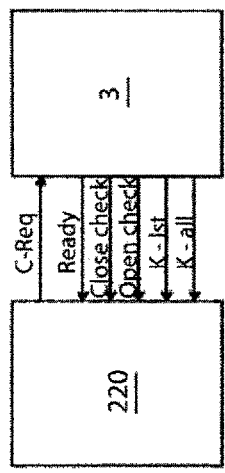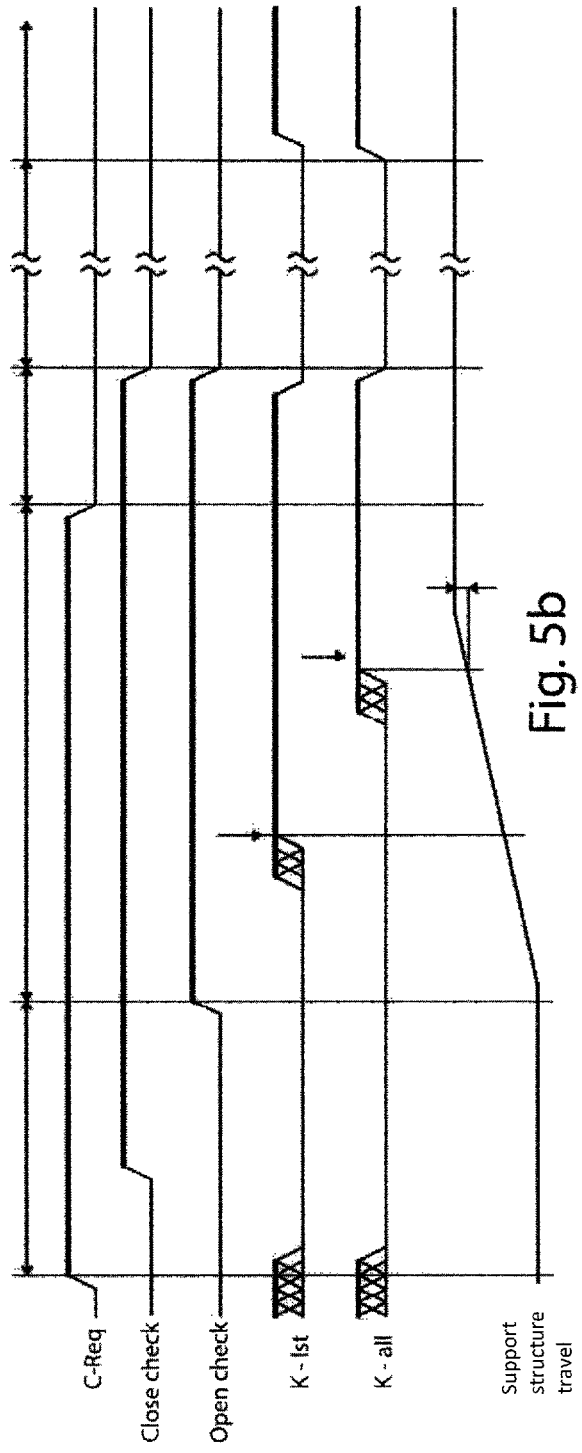

SAFETY SYSTEM FOR NEEDLE PROBE CARD FOR HIGH-VOLTAGE AND HIGH-CURRENT TEST ON POWER SEMICONDUCTOR DEVICES, RELATED TEST MACHINE AND CORRESPONDING TESTING METHOD

CROSS-REFERENCE TO RELATED APPLICATIONS

This application is a National Phase Application of PCT International Application No. PCT/IB2021/054645, having an International Filing Date of May 27, 2021 which claims priority to Italian Application No. 102020000012556 filed May 27, 2020, each of which is hereby incorporated by reference in its entirety.

FIELD OF THE INVENTION

The present invention relates to a safety system for needle probe cards applicable to a test machine, in particular for high-voltage and high-current testing of semiconductor devices, in particular power semiconductor devices, for example for testing static parameters and dynamic parameters of said semiconductor devices.

The present invention further relates to a test machine particularly adapted to perform tests on semiconductor devices, e.g., power semiconductor devices, for example for testing static parameters and dynamic parameters of said semiconductor devices.

BACKGROUND OF THE INVENTION

It is well known in the field of semiconductor devices to perform tests on electronic devices before they are suitably packaged on a substrate or chip and sold for electrical/electronic applications.

Tests performed on semiconductor devices for the static parameters of the same device, carried out in direct current, and tests performed on semiconductor devices for the dynamic parameters, in which alternating electronic signals are applied to the semiconductor devices, e.g., with state switching or polarity reversal, are currently known.

The two tests normally occur at different times in the fabrication of the same semiconductor device. Further, in tests for evaluating and/or verifying dynamic parameters, wherein switches are provided, the problem of parasitic inductances emerges, which, during the switching of the signals, may cause overvoltages that could damage both the test machine and the device under test. Therefore, tests for evaluating dynamic parameters are very difficult to perform, especially those for verifying and/or evaluating the actual operation of the device under test, especially at an early stage of the fabrication/production process.

These tests for evaluating and/or verifying dynamic parameters are even more complex when they must be performed on power devices wherein the powers involved are very high, the tests being carried out at high voltages and high currents. In effect, even in the presence of very small parasitic inductances, the overvoltages caused by these parasitic inductances during high-voltage and high-current testing would cause irreparable damage to the device under test.

There is an increasing demand from manufacturers of power semiconductor devices to be able to detect possible malfunctions in power semiconductor electronic devices as early as possible in the process of manufacturing them. The demand is increasingly significant in particular to be able to perform tests on such electronic devices when they are still in an early stage of the fabrication process, ideally to carry out testing directly on the semiconductor wafer, on which a plurality of electronic devices has been fabricated as known to a person skilled in the art. To date, there are no known test machines capable of performing high-voltage and high-current testing on power electronic devices while said devices are still incorporated in the wafer with other electronic devices, in particular for performing tests for evaluating and/or verifying the dynamic parameters of power electronic devices before they have been separated individually.

In the more specific area of testing for power semiconductor devices, there are also well-known needle probe cards capable of performing tests on electronic devices. Each currently known probe card is capable of putting a plurality of needles in contact, wherein a current may flow, on the emitter or anode of a power semiconductor device under test. Said needle probe cards comprise a large number of needles in order to be able to apply a very high current on a power semiconductor electronic device while being able to exploit the largest possible area of the semiconductor device in order to reduce the current density per unit area of the device and to divide the current over several needles.

Needle probe cards are known which comprise an intrinsic safety system able to monitor the current entering the probe card. If the total input current to the probe card exceeds a predetermined direct current value, this safety system may interrupt the input current to the probe card.

From U.S. Patent Application US20080290882A1 a test apparatus and the method thereof are known for applying high-current test stimuli to a semiconductor device, either still in the wafer or on a chip. Said apparatus comprises a plurality of probes, in the form of needles, for electrically coupling to respective contact points on the semiconductor device. The apparatus comprises a plurality of current limiters electrically coupled to the plurality of probes, and a current sensor electrically coupled to the plurality of probes. The current limiters are used to limit the flow of current passing through a respective probe, and the current sensor is used to provide a signal when the current detected at any contact point of the plurality of probes exceeds a threshold level. In a preferred embodiment, said current limiters are bypass circuits.

It should be noted that the current limitation may still cause issues to arise on the device under test and/or the support structure on which the devices under test are lying during the execution of the tests. In effect, the current limitation could cause overheating as it is not able to totally interrupt the flow of said current. In addition, the use of a bypass circuit means that this solution is not applicable to needle probe cards that must perform tests to evaluate or verify the dynamic parameters of the power semiconductor device on high-voltage and high-current tests due to the increase in parasitic inductances.

Several functional tests on semiconductor electronic devices, in particular power devices, are known, referred to in the industry by the acronyms RBSOA, FBSOA, and SCSOA, in which voltages on the order of kVolts and currents of hundreds of amperes, up to several thousand amperes kA, are envisaged to be used to perform such functional tests. In view of the voltages and currents used in said tests, it is obvious that any malfunction or breakage of the devices under test could damage said devices under test and/or the support structure on which said devices are housed during the performance of said tests and/or one or more needles of the needle probe card through which the test is being performed.

It is well known to the person skilled in the art that the support structures made of conductive materials, on which the device under test is housed during the execution of the test, must be fabricated with a high degree of accuracy, since they must be planar and have very smooth contact surfaces with the device under test. Therefore, these support structures are very delicate, as any short circuits caused by the breakage of a device under test, or localized overheating, may cause loss of local conductivity of said support structure, requiring maintenance and/or periodic replacement.

There are currently no known safety systems that would allow the needle probe card to interrupt, and not just limit, the power supply to all needles in the needle probe card via a control system even in the case wherein an overcurrent occurs in only one of the needles present. In addition, there are currently no known safety systems that allow the needle probe card to be powered, by flowing a current with a high amperage and/or a very high voltage to its needles, only when all the needles are in contact with the device under test. In effect, if some of the needles are not in proper contact with the semiconductor device, the current with which the probe card will be powered will be divided over a smaller number of needles, increasing the amount of current flowing in each needle, causing the problems well known to a person skilled in the art.

In addition, there are no known safety systems capable of adequately protecting the safety of the needles on the probe card, in particular to prevent a needle malfunction from spreading to adjacent needles, thus protecting not only the probe card but also the device under test and the conductive support structure underneath the device under test.

At present, there are no known safety systems that are capable of preventing damage to the conductive support structure by ensuring that localized temperature increases do not occur on the surface of said conductive support structure, due to the causes indicated above, whereby said support structure loses local conductivity.

SUMMARY OF THE INVENTION

The present invention proposes to solve all of the aforesaid technical problems and many others by providing a needle probe card safety system capable of quickly interrupting the current circulating in each individual needle of a needle probe card, in particular, a safety system preferably able to prevent, in every single needle in a probe card, a current flowing that is higher than a specific threshold, safeguarding both the needle wherein an anomaly is occurring but also the other needles in the probe card, those in the vicinity as well as the more distant ones, in addition to the support structure where the device under test is housed.

One aspect of the present invention relates to a safety system for a needle probe card for test machines for high-voltage and high-current testing of power semiconductor electronic devices.

A further aspect of the present invention relates to an assembly comprising a needle probe card and a safety system having the features described and claimed herein.

A further aspect of the present invention relates to a test machine for high-voltage and high-current testing of power semiconductor electronic devices.

A still further aspect of the present invention relates to a method for verifying the proper needle contact on a device under test.

Ancillary features of the safety system, test machine, and method of the present invention are also described.

BRIEF DESCRIPTION OF THE DRAWINGS

The features and advantages of the safety system, the test machine, and the method will be clear and obvious from the following patent description, which will describe various possible embodiments of the present invention, and from the appended figures, wherein respectively:

FIG. 4A shows the trend of the voltage and current in a transient, whereas FIG. 4B shows an enlargement wherein the trend of the collector current and the voltage Vce in the case of breakage of the device under test following the actuation of the safety system according to the present invention is visible;

FIGS. 5A and 5B show the communication between the safety system according to the present invention and the moving system of the support structure, wherein FIG. 5A shows a block diagram indicating the signals exchanged between the safety system and the moving system; FIG. 5B shows the comparison of the waveforms of the various signals exchanged between the safety system and the moving system as the position of the support structure changes.

DETAILED DESCRIPTION

Figure 1:
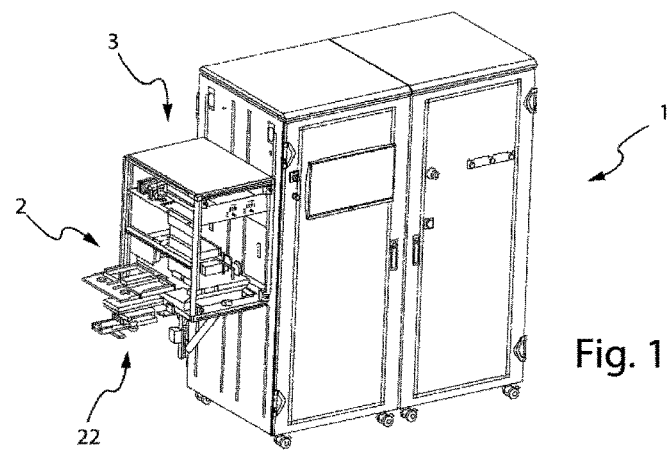
FIG. 1 shows in a perspective view a test machine including a needle probe card and a safety system for said needle probe card, according to the present invention.

With reference to the aforementioned figures, the numerical reference 3 indicates the safety system as a whole, according to the present invention. On the other hand, the numerical reference 1 refers to a test machine as a whole, while the numerical reference 2 refers to a needle probe card as a whole.

The safety system 3 according to the present invention is particularly adapted for use with needle probe cards 2, which in turn are suitable for use on, e.g., comprised in and/or connectable to, test machines 1 for performing high-voltage, high-current testing of power semiconductor electronic devices, such as IGBTs, MOSFETs and/or FRDs, in particular Si IGBTs, Si FRDs, SiC MOSFETs, GaN MOSFETs.

For the purposes of this description, "high-voltage test" means tests wherein voltages on the order of kV may be applied to a device under test; this value may vary depending on the test performed. In addition, for the purposes of this description, "high-current test" means tests wherein currents on the order of hundreds of amperes may be applied to a device under test, up to thousands of amperes kA; this value may vary depending on the test performed.

More generally, said needle probe card 2 comprises a plurality of needles N, which are adapted to be placed in contact with a device under test DUT in order to perform one or more high-voltage and high-current tests on said device under test DUT. Each needle N is adapted to allow the flow of an electric current. Said electric current may vary depending on the type of test performed on a device under test DUT and depending on the type of device under test DUT to be tested. Preferably, a needle probe card 2 comprises a number of needles greater than or equal to twenty needles N. Said needle probe cards 2 may be cantilevered or vertical. Possible structural features of the needle card 2 are, for example, described in the following patent applications AT7587U1, AT7714U1, AT14209U1 in the name of T.I.P.S. MESSTECHNIK GMBH. Further details about said needle probe cards 2 will not be described since said needle probe card 2 is not the subject of the protection, as such, and because it is known per se to a person skilled in the art.

Said safety system 3, according to the present invention, comprises: a control unit 32 and a plurality of switching devices 34.

Said control unit 32 is able to determine the current flowing through each individual needle N.

Said plurality of switching devices 34 is adapted to selectively interrupt the current flowing in said needles N. In particular, said switching device 34 is adapted to open the circuit in which the current flows. Each switching device 34 is a solid-state switch.

Going into greater detail of the embodiment of the safety system 3, according to the present invention, each needle N of said needle probe card 2 is associated with at least one switching device 34. In particular, at least one switching device 34 is associated with each needle N of said plurality of needles N, e.g., each needle N is placed in series with at least one, preferably only one, switching device 34, even more preferably each switching device 34 is associated with a single needle N.

The control unit 32 of the safety system 3 is adapted to drive each individual switching device 34 to selectively interrupt the flow of current in the corresponding needle N.

The present invention allows the current passing through each of said needles N to be interrupted selectively, thereby providing a capillary check, particularly on each needle N.

The present invention allows the current circulating in each individual needle N to be interrupted selectively, in addition to allowing the current circulating in said needle probe card 2 to be fully interrupted.

The present invention allows the current circulating in said needle probe card 2 to be fully interrupted by opening all switching devices 34 associated with all the needles N. This solution allows the current to the device under test DUT to be fully interrupted in the shortest time possible, thus preserving both the device under test DUT and the needle probe card 2. Such a solution also keeps the parasitic inductance of the entire test system very low. In effect, this solution prevents the introduction of devices that could increase the parasitic inductance of the entire test system.

The safety system 3 according to the present invention is particularly advantageous for needle probe cards 2, which comprise a plurality of needles N adapted to be in contact with one or more devices under test DUT, wherein at least two needles N are associated with each device under test DUT in order to perform high-voltage and high-current tests. Preferably, said safety system 3 is particularly advantageous for needle probe cards 2 comprising a plurality of needles N which are adapted to be placed in contact with a single device under test DUT in order to perform one or more high-voltage and high-current tests on said single device under test DUT.

In a preferred embodiment of the safety system 3 according to the present invention, said control unit 32 in turn comprises: at least one processing unit 321 and a plurality of current meters 323.

In a preferred embodiment, each needle N of said needle probe card 2 is associated with at least one current meter 323. The current measured by each current meter 323 is sent to and/or received by said at least one processing unit 321.

In a preferred embodiment of the safety system 3 according to the present invention, each needle N of the needle probe card 2 is associated with both a switching device 34 and a current meter 323, said current meter being placed in series, preferably said switching device 34 and said current meter 323 being in series with each other. Even more preferably, each switching device assembly 34 and current meter 323 in series with each other are associated with a single needle N.

Said control unit 32, depending on the data processed by said processing unit 321, is able to decide when to selectively switch, preferably to open, one or more of said switching devices 34 on one or more of said needles N. In particular, if a current meter 323 detects that an electric current in a needle N is flowing in excess of a predetermined threshold, said processing unit 321, by processing this data, may determine that this overcurrent is present on only one needle N of the plurality of needles N present in said needle probe card 2. In this event, the control unit 32 is able to interrupt the current flowing even only in said needle N, appropriately controlling the corresponding switching device 34, while still allowing an electric current to flow in the other needles N. In effect, it is possible that an anomaly may occur in only a small area of the device under test DUT, e.g., a short circuit caused by a manufacturing defect of said device under test DUT, or because the single needle N is malfunctioning.

Preferably, the control unit 32 may be arranged to determine an average current value based on the current measured by the plurality of current meters 323 at an instant of current measurement. The control unit 32 may also be arranged, by driving said switching devices 34, to interrupt the current flowing through the plurality of needles N when the at least one current meter 323 measures a current greater than or less than the average current value of at least one predetermined current deviation threshold.

In a numerical, non-limiting example, if the average current value is 10 A, the current deviation threshold may be, for example, 1 A. Thus, if the current measured by a current meter is less than 9 A or greater than 11 A, the control unit 32 may interrupt the current flowing through the plurality of needles N.

For example, the average value may be updated over time in successive instants of current measurement according to a predetermined time period or in real time. Further, said switching devices 34 may interrupt the current flowing in each needle N substantially simultaneously with each other, or in cascade, in a succession of instants of time.

In this way, it is possible to obtain a "predictive" function of the impending DUT failure, which allows the integrity of a contacting system to be preserved (e.g., usually including the needle probe card and a support surface for the DUT, also known as a "chuck"), as well as the mechanical integrity of the DUT under test (even more important if the DUT is in a wafer). In effect, in this embodiment, it is not necessary for the threshold at which the current flowing in a needle is interrupted to correspond with the maximum current that may flow in that needle (which could cause damage to both the contacting system itself and to the DUT).

In the present embodiment, the threshold is defined by calculating an average current value measured by the current meters 323.

Alternatively, instead of the average current value, a preset maximum current threshold may also be set, the value of which may be less than or equal to the maximum current that may flow through these needles.

This will allow the threshold to be lower than the maximum current that may flow through said needle. A current value flowing in one needle, which is different from the average value of current flowing in the other needles, may be a signal that the DUT is breaking.

The act of interrupting the current flowing through the plurality of needles N serves to prevent the contact system and its needles from being damaged. In effect, it is well known that a power semiconductor subjected to the electrical stimulus of high switching voltages and currents (dynamic parameter or AC test) will begin to break at a point in its area. All the current flowing through the DUT area will tend to flow into this point, due to the known rules of electric current looking for the easiest route to take, thus concentrating all the power flowing through that point and tending to melt and then weld the material (needles, DUT, chuck) at that point.

According to this embodiment it is therefore possible to mechanically preserve not only the probe card but also the device under test and the conductive support structure underneath the device under test.

Preferably, the safety system may comprise a plurality of voltage meters arranged to measure respective voltage values at predetermined electrical connection terminals arranged in said device under test DUT. Preferably, in such a case, the control unit 32 may be arranged to determine an average voltage value based on the voltage values measured by the voltage meters at an instant of voltage measurement. The control unit 32 may further be arranged, by driving said switching devices 34, to interrupt the current flowing through the plurality of needles N when at least one voltage meter 323 measures a voltage value greater than or less than said average voltage value by at least a predetermined voltage deviation threshold value.

In other words, the control unit 32 may interrupt the current flowing through the plurality of needles N when the difference between the voltage measured by one voltage meter, relative to the voltage of the other voltage meters, is greater than a threshold. This difference is an indication that the DUT is "breaking," as the concentration of the current at the breaking point causes a surface current and thus causes a voltage gradient on the surface itself.

In a numerical, non-limiting example, if the average voltage value is 10V, the voltage deviation threshold may be, for example, 1V. Thus, if the current measured by a current meter is less than 9V or greater than 11V, the control unit 32 will be able to interrupt the current flowing through the plurality of needles N.

For example, the predetermined electrical connection terminals may be arranged at various points in the device under test DUT whereby they are substantially equally spaced from each other and whereby they cover as much area of the DUT as possible.

In one possible embodiment, said control unit 32 includes a computational unit, e.g., a microprocessor and/or a microcontroller, capable of receiving data, e.g., from said processing unit 321, and appropriately driving said switching devices 34. Said processing unit 321 may be integrated into the control unit 32. Said processing unit 321 is capable of processing signals generated by all the current meters 323 in order to process, at least partially, the data to enable said control unit 32 to suitably drive said switching devices 34. Said current meters 323 may be simple sensors and/or devices capable of transmitting a datum corresponding to that which is detected by a sensor.

In a preferred, exemplifying, and non-limiting embodiment, said control unit 32 is designed to selectively switch, preferably to open, the switching device 34 corresponding to the needle N, wherein a current exceeding a predetermined current has been measured by a current meter 323, and to switch, preferably to open, all the switching devices 34 in cascade, for example from the nearest to the most distant, or all at the same time, in order to prevent the problem that has emerged on a predetermined needle N from propagating to the other needles N of the needle probe card 2, thus reducing the risks of failure and/or damage to the entire needle probe card 2, the device under test DUT, and/or the support structure 22.

Said support structure 22 is adapted to house one or more devices under test DUT during the execution of one or more tests. Said support structure 22 is made of a conductive material, preferably having high conductive properties, such as copper and/or gold, preferably being made of brass coated with a gold layer. On said support structure 22 lies the collector or cathode of a device under test DUT. Said device under test DUT is placed in electrical contact with said support structure 22, which is conductive. The safety system 3 allows the current to the device under test DUT to be completely interrupted in the shortest time possible, thus preserving both the device under test DUT and said support structure 22.

Said support structure 22 is movable along at least one vertical axis, preferably in space, by means of a moving system 220. Said support structure 22 is selectively moved by means of said moving system 220 to and from said needle probe card 2 in order to perform one or more tests on one or more electronic devices under test DUT and to allow one or more electronic devices to be housed and/or to remove the electronic devices following the test. In one possible embodiment, which is exemplifying and non-limiting, of the safety system 3 according to the present invention, said safety system 3 is electronically connected to said moving system 220 of the support structure 22.

In a preferred, exemplifying and non-limiting embodiment, each switching device 34 of the safety system 3 is a power semiconductor device designed to form a normally closed switch, allowing current to flow through it. Said switching device 34 is designed in such a way that switching it allows for the flow of current to be impeded, forming an open switch. Said circuit breaker device 34 is capable of completely stopping the circulating current when it opens.

By way of non-limiting example, in a possible embodiment of the safety system 3 according to the present invention, said control unit 32 is connectable to a dummy test card 14 and/or a bypass test card 16. The connection of said control unit 32 to the dummy card 14 and/or to the bypass test card 16 makes it possible to secure the device under test DUT and/or the test machine 1 during the execution of different types of tests related to both static and dynamic parameters, as well as in case of malfunctions.

More generally, said dummy card 14 is adapted to allow the execution of tests on dynamic parameters of the device under test DUT with an inductive load. In particular, said dummy card 14 allows for a test configuration defined as half-bridge, known per se to a person skilled in the art. Said dummy card 14 comprises a protection diode and/or an auxiliary driver to allow the execution of switching tests with inductive load on the device under test DUT. The dummy card 14 may be quickly replaced to meet various requirements of devices under test DUT.

More generally, said bypass test card 16 is adapted to generate an alternative circuit for the current that should act on said device under test DUT in the case of anomalies on the device under test DUT in order to avoid damage to the test machine 1. Said bypass test card 16, however, as is known, is not capable of responding quickly when an anomaly on a single needle N of the needle probe card occurs.

In a preferred exemplifying and non-limiting embodiment of the safety system 3 according to the present invention, an impedance adapter 35 is included. Said impedance adapter 35 is adapted to reduce parasitic inductance while performing tests on the device under test DUT.

In particular, said impedance adapter 35 is adapted to reduce parasitic inductance both during normal execution of the tests and in the case wherein said device under test DUT has malfunctions, for example, breakages.

In a possible exemplifying and non-limiting embodiment, said impedance adapter 35 is designed by first carrying out a study of the possible paths where the current may flow, both during the correct execution of the test and in the case of malfunctions, in order to be able to reduce, as much as possible, the parasitic inductance associated with such current paths, for example, by reducing their extension as much as possible, and then, as a function of the current paths identified and shortened whenever possible, a compensation of the parasitic inductance of the test system is envisaged with a local capacitance calculated according to the desired objectives. The capacitance to be adopted to obtain such an impedance adapter 35 turns out to be very small compared to the currents used during the tests, with the currents involved in the tests, as specified before, able reach hundreds or thousands of amperes. In light of the reduced introduced capacitance, it is therefore possible to position said impedance adapter 35 close to the device under test DUT.

In a preferred exemplifying and non-limiting embodiment of the safety system 3 according to the present invention, said control unit 32 is interfaceable with a moving system 220 of a support structure 22. As specified above, said support structure 22 is adapted to accommodate thereon at least one, e.g., one or more, devices under test DUT. In particular on said support structure 22 one or more devices under test DUT are housed. Said control unit 32 is adapted to assist in driving the moving system 220 in order to suitably move said support structure 22, for example to ensure that all needles N of the needle probe card 2 are in contact with the single device under test DUT. In the present embodiment, by means of said control unit 32, it is possible to assist in suitably driving said moving system 220 of the support structure 22 by bringing said support structure 22 closer to the needle probe card 2 until all the current meters 323 detect the possibility of a current passing through said needles N. This operating condition corresponds to a configuration in which all the needles N are actually in contact with said device under test DUT. This solution allows a test on a device under test DUT to be prevented from starting before all the needles N have properly come into contact with said device under test DUT, solving the technical problems well known to the person skilled in the art in the case of non-contact of needles N on the device under test DUT, in particular preventing the non-circulating current in a needle N not in proper contact with said device under test DUT from being distributed on the other needles N.

Figure 2:
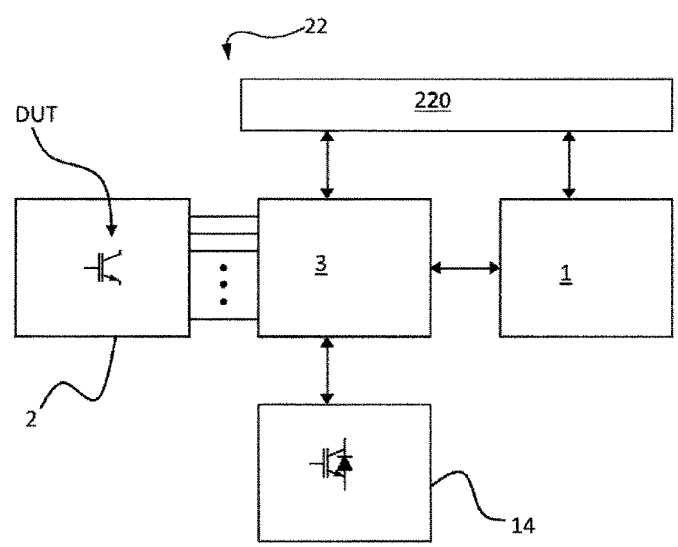
FIG. 2 shows a simplified block diagram of a test machine comprising a needle probe card and a safety system for said needle probe card, according to the present invention.

FIG. 2 shows a simplified block diagram of the test machine 1 comprising a needle probe card 2 and a safety system 3 for said needle probe card 2, according to the present invention. In particular, it may be understood from this figure that the safety system 3 is interposed between the test machine 1 and the needle probe card 2. As may be seen from FIG. 2, the safety system 3 is able to check each circuit directed to each needle N of the needle probe card 2, which allows the testing of one device under test DUT at a time. As shown in FIG. 2, the control system 3, preferably the control unit 32, is adapted to interface with the support structure 22, and in particular with the moving system 220, in particular being able to assist in driving said moving system 220 of the support structure 22. Said control system 3, and in particular said control unit 32, is able to support the check performed by the test machine 1 on the moving system 220 of the support structure 22, in order to ensure that all the needles N of the needle probe card 2 are in contact with the device under test DUT before starting a test on said device under test DUT.

As shown in FIG. 2, the control system 3, preferably the control unit 32, is adapted to interface with said dummy test card 14 as specified above.

Figure 3:
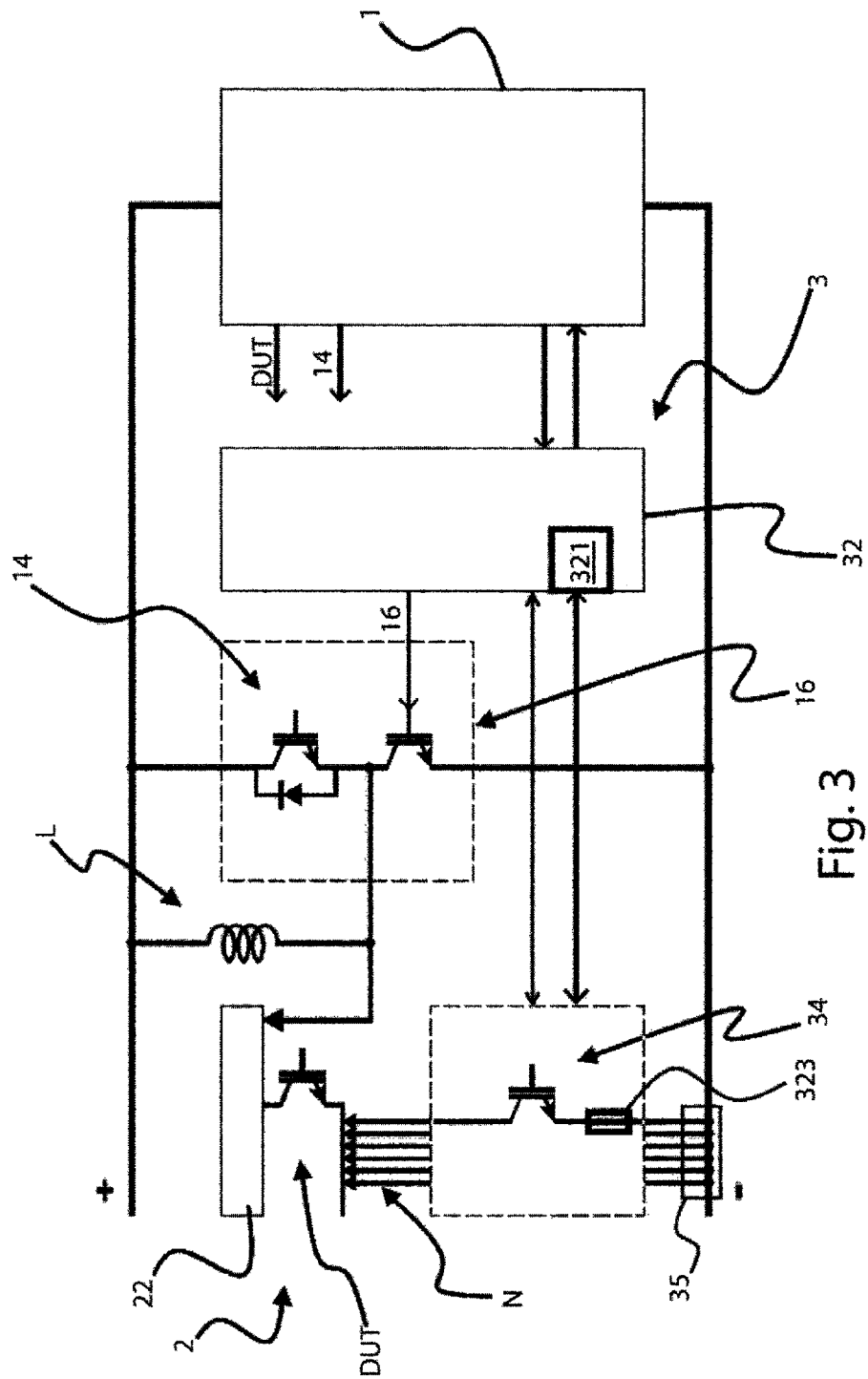
FIG. 3 shows a simplified wiring diagram of the test machine comprising a needle probe card and a safety system for said needle probe card, according to the present invention.

FIG. 3, on the other hand, shows a simplified wiring diagram of the test machine 1 comprising a needle probe card 2 and a safety system 3 for said needle probe card 2, according to the present invention. It is apparent from FIG. 3 how said test machine 1 communicates with said safety system 3, and in particular with said control unit 32. The same test machine 1 is suitably connected electronically to the device under test DUT, and in particular to the gate of this device under test DUT. The same test machine 1 is suitably connected electronically to the dummy test card 14, and in particular to the gate of the driver included therein. Said safety system 3, and in particular the control unit 32, is connected to the bypass test card 16, and in particular to the gate of a normally open switching device, as already known to a person skilled in the art. As is known, the test machine 1 connected to the needle probe card 2 has a load L of the inductive type in order to perform particular tests on the dynamic parameters of the device under test DUT, with a configuration shown in FIG. 3, for example, cooperating with said dummy test card 14.

It is moreover apparent from FIG. 3 that the control unit 32 is able to suitably drive the switching devices 34. In the illustrated embodiment, the switching devices 34 are placed in series in the circuit of each needle N. In the illustrated embodiment, for simplicity of illustration only one switching device 34 placed in series with respect to a needle N is shown, but the concept is repeated for each needle N, albeit not shown. Also similarly included in series in the circuit of each needle N is a current meter 323. Measurements made by the current meter 323 are received and/or acknowledged by the processing unit 321, for example comprised in the control unit 32, which may determine whether the current flowing through one or more needles N included in the needle card 2 exceeds a predetermined threshold, for example a safety threshold. According to the data processed by the processing unit 321, the control unit 32 will be able to suitably drive the switching devices 34, in order to selectively interrupt a possible current in said needle N.

From FIG. 3 it is also apparent that one device under test DUT is tested at a time and that the same device under test DUT is placed in electrical contact with said support structure 22, which is conductive; in particular the collector of said device under test DUT is placed in electrical contact with said support structure 22. On the other hand, said needles N of the needle probe card 2 are adapted to make electrical contact with the emitter of the device under test DUT. Lastly, the gate of the device under test DUT is electronically connected to the test machine 1.

FIG. 3 further illustrates that the safety system 3 advantageously further comprises an impedance adapter 35, which is adapted to reduce parasitic inductance when performing tests on the device under test DUT. The location shown is by way of non-limiting example only.

More generally, the safety system 3 according to the present invention is particularly suitable for application on test machines 1 and/or needle probe cards 2 designed for testing one power semiconductor electronic device at a time, for example of the IGBT, MOSFET and/or FRD type. For the purposes of this description, power electronic semiconductor devices are defined as devices capable of operating with power electrical/electronic signals, and thus high voltages and high currents. For the purposes of this description, the term IGBT is an acronym for "insulated gate bipolar transistors" the technical and operating features of which are known to a person skilled in the art. For the purposes of this description, the term FRD is an acronym for "fast-recovery diodes," the technical and operating features of which are known to a person skilled in the art.

Even more preferably, said devices under test DUI are made with SiC, GaN and/or Si technology. In particular, said devices under test DUT may be power semiconductor electronic devices IGBT, MOSFET and/or FRD, such as Si IGBTs, Si FRDs, SiC MOSFETs and/or GaN MOSFETs.

More generally, the safety system 3 according to the present invention is designed for needle probe cards 2 for test machines 1 operating on a single device under test DUT at a time for performing high-voltage and high-current testing for evaluating and/or verifying static parameters and/or dynamic parameters of the device under test DUT. For the purposes of this description, the term "test to evaluate and/or verify the static parameters of a device under test DUT" means, for example, tests performed with measurement methods referring to the IEC60747 standard, e.g., by performing measurements known in the field by the following acronyms: IGES, ICES, VCES, VCES-1, VGETH, VCEsat, VF, gFS, etc.

For the purposes of this description, the term "test to evaluate and/or verify the dynamic parameters of a device under test DUT" means, for example, the tests performed with measurement methods referring to the IEC60747 standard, e.g. by performing measurements known in the industry as: DOUBLE PULSE INDUCTIVE LOAD, SWITCHING ON INDUCTIVE LOAD—TURN ON/OFF, SWITCHING ON INDUCTIVE LOAD FWD RECOVERY, SINGLE PULSE CLAMPED INDUCTIVE LOAD; SINGLE PULSE UNCLAMPED INDUCTIVE LOAD, SHORT CIRCUIT WITHSTAND TESTING (SCSOA).

In particular, the safety system 3 according to the present invention is designed for needle probe cards 2 for test machines 1 operating on a single device under test DUT at a time for performing high-voltage and high-current testing for evaluating and verifying dynamic parameters of a device under test DUT, which is a power semiconductor electronic device, for example IGBT, MOSFET and/or FRD, preferably made with SiC, GaN and/or Si technology. For performing such type of tests wherein rapid voltage and/or current switching is envisaged, the safety system 3 advantageously comprises an impedance adapter 35, adapted to reduce parasitic inductance while performing tests to evaluate and verify dynamic parameters on the device under test DUT. Said impedance adapter 35 allows tests to be performed to evaluate and verify dynamic parameters on both inductive and short circuit loads. In particular, said impedance adapter 35 is especially useful for tests on devices under test DUT which are able to work with very high current commutations—elevated di/dt—which otherwise could not be tested, since they would be irreparably damaged due to the overvoltages generated by the parasitic inductances.

The safety system 3 according to the present invention is capable of intervening very quickly following the occurrence of a critical situation or anomaly as described above, including in the case of testing for verification and/or evaluation of the dynamic parameters of the device under test DUT. In a preferred embodiment of the safety system 3, said safety system 3 is designed to interrupt the passage of current in at least one needle N, preferably in all needles N, in a time of less than or at most equal to 300 nsec. Further, the technical solution of the present invention does not introduce additional parasitic inductances.

Figure 4B:
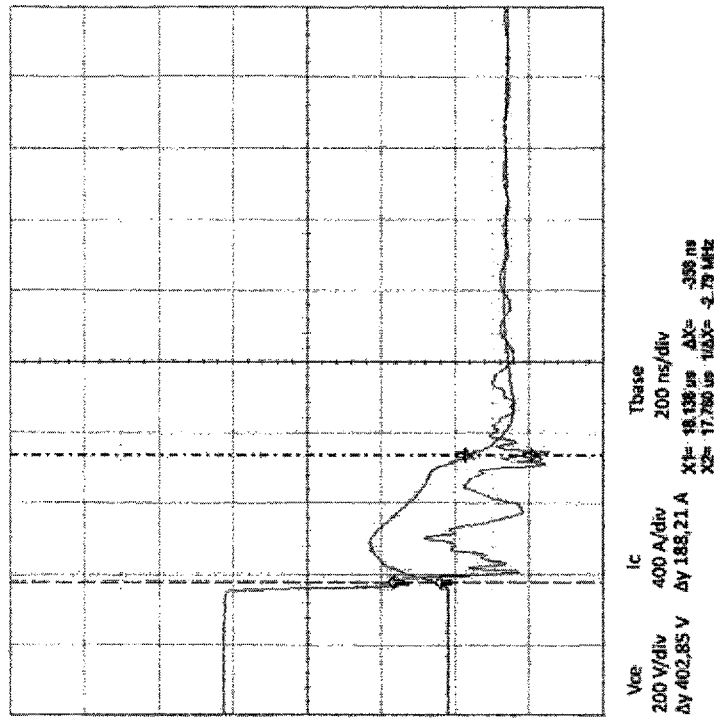
FIGS. 4A and 4B show the voltage and current signals applied to a device under test by means of a needle probe card, in addition to the measured signals present in the device under test, in the case of actuation of the safety system, according to the present invention; in particular.
Figure 4A:
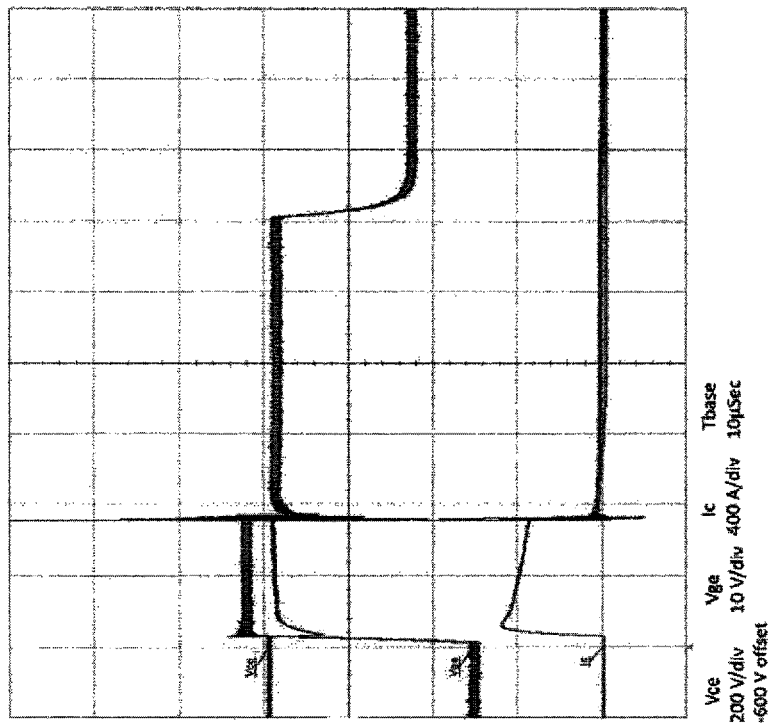

FIGS. 4A and 4B show voltage and current signals applied to a device under test DUT via a needle probe card 2 in addition to the measured signals present in the device under test DUT in the case of actuation of the safety system 3 according to the present invention. The figures relate to the intervention of the safety system 3 according to the present invention during the performance of a test for verifying and/or evaluating one or more of the dynamic parameters of the device under test DUT. In particular, FIG. 4A shows the trend of voltage and current in a transient; in particular the following are shown: the voltage trend Vge, hence the voltage applied between the gate and emitter of the device under test DUT by a test machine 1; the voltage trend Vce, hence the voltage applied between the collector and emitter of the device under test DUT during the execution of the test; and the collector current trend Ic, hence the current flowing from the collector of the device under test DUT.

For a better understanding of the figure, the Vce signal is shown in the 200V/division scale, the Ic signal is shown in the 400 A/division scale, and the Vge signal is shown at 10V/division.

By analyzing FIG. 4A it is apparent how, via the test machine 1, a variation or switching of the voltage Vge is generated, for example by suitably supplying the gate of the device under test DUT. As a result of this variation or switching, a transient of both voltage Vce and current Ic may be seen until known values are reached.

From FIG. 4A, the occurrence of an anomaly, in which there is an uncontrolled increase in the voltage Vge, is clearly visible. This anomaly causes a variation of the voltage Vce which falls to zero, generating a short circuit. This short circuit between the collector and the emitter of the device under test DUT causes an uncontrolled increase of the current Ic. In the event of such an anomaly, the safety system 3 comes into action. In particular, as the current Ic increases, the at least one current meter 323 will measure an increase in current flowing in at least one needle N exceeding a certain threshold. This measurement, as well as the measurements of all current meters 323 in the safety system 3, is processed by said processing unit 321. Said control unit 32, according to the data processed by said processing unit 321, is able to decide the switching of all the switching devices 34, thus opening them, interrupting the current flowing in all the needles N in which the current was flowing. In the case illustrated in FIG. 4A, said control unit 32 drives said switching devices 34 by switching them all at effectively the same time, stopping the flow of said abnormal current and blocking the flow of current Ic.

FIG. 4B shows an enlargement wherein the collector current trend Ic and a sudden decrease of the voltage Vce are visible, as a result of the anomaly described above, for example, the breakage of the device under test DUT. For a better understanding of the figure, the Vce signal is shown in the 200V/division scale, and the Ic signal is shown in the 400 A/division scale.

As is clearly shown in FIG. 4B, the current trend Ic, after a period of less than 100 nsec, decreases to a value whereby it does not cause further damage to the device under test DUT and/or to the support structure 22. In effect, the safety system 3 is able to completely interrupt the current flow Ic in a time of less than 200 nsec. From this figure, the excursions made by the two signals Ic and Vce are quite understandable. Moreover, the safety system 3 according to the present invention allows such current to be quickly interrupted due to the fact that no additional parasitic inductances are introduced.

More generally, the threshold of current flowing through a needle N, measurable by a current meter 323, above which there is an anomaly, may vary depending on the test performed, type of needle probe card 2, number and type of needles N used in the needle probe card, and/or device under test DUT to be tested.

The solution according to the present invention allows for intervening in a very short time in the case of anomalies, preventing the damage present in the device DUT and/or on a single needle N from increasing and the underlying support structure 22 and/or the needle probe card 2 from being damaged as well.

More generally, the safety system 3 according to the present invention is designed to operate on one device under test DUT at a time, said device being placed on a support, called a "die" in the field, suitable for housing said single device under test DUT. In such an embodiment, the safety system 3, and consequently the test machine 1, is designed to be able to operate on a single device under test DUT, which is suitably placed on a support or "die," the latter being adapted to be housed on said support structure 22. Said supports or "dies" are designed such that said device under test DUT has the emitter in electrical contact with said support structure 22 in which it is housed.

In an alternative embodiment, the safety system 3 according to the present invention is designed to operate on devices under test DUT still incorporated in a wafer of semiconductor material. In the present embodiment, the safety system 3 and consequently the test machine 1 are designed to be able to operate on devices under test DUT, one at a time, which are still incorporated in a common wafer of semiconductor material, in particular being able to perform tests for evaluating and/or verifying static parameters and dynamic parameters of a device under test DUT. Said support structure 22 is designed to accommodate said wafer. Said wafer is housed in said support structure 22 such that the devices under test DUT incorporated in the wafer have the emitter in contact with said support structure 22. The safety system 3 according to the present invention is particularly advantageous in performing tests for verifying and/or evaluating one or more of the dynamic parameters of the single device under test DUT incorporated in the wafer. In effect, due to this safety system 3, it is possible to intervene quickly in the case of anomalies, thus preventing any overcurrent and/or overvoltage and/or power loss from damaging any electronic devices incorporated in the wafer near the device under test DUT. Moreover, said safety system 3, advantageously comprising said impedance adapter 35, reduces the risk of the onset of overvoltages that could damage not only the device under test DUT but also neighboring ones.

More generally, the safety system 3 according to the present invention may be associated with a needle probe card 2, and consequently with a test machine 1, able to perform high-voltage and high-current testing of power semiconductor devices in whichever form the device may take before said device is packaged in a chip.

In a preferred embodiment of the safety system 3, according to the present invention, said safety system 3 is substantially identical to the two previously illustrated embodiments relating to operation on individual devices under test DUT, each placed on a relevant support or "die" and operating on devices under test DUT, one at a time, which are still incorporated in a common wafer. More generally, the differences between a test machine 1 able to perform tests on devices under test DUT each placed on a relevant support or "die" and a test machine 1 able to perform tests on devices under test DUT which are still incorporated in a common wafer, may be ascribed to a different support structure 22, which must accommodate different objects having different structures and spatial occupations, and consequently the moving system 220, which will be able to place the individual devices under test DUT, one at a time, on the same needle probe card 2, moving the entire wafer, as well as possibly varying the motion in order to place all the needles N in contact with a single device under test DUT. Preferably, in the embodiment wherein the work is performed on devices under test DUT still incorporated on a wafer, it is necessary to adopt countermeasures and solutions to allow greater motion of the needle probe card 2 and/or to solve any problems arising from parasitic inductances present in the current conductors, especially during the execution of tests on dynamic parameters of the device under test DUT. This may be done by appropriately designing the impedance adapter 35, as specified above.

In light of this description, it is evident how, through tests performed on devices under test DUT still incorporated on a wafer, it is possible to understand, at an early stage in the process of manufacturing power semiconductor devices, how many semiconductor devices it will be possible to make from a single wafer and/or the quality and/or performance thereof.

Moreover, tests performed directly on wafers may allow for determining and/or correcting any critical procedural steps in the process of making said semiconductor electronic devices on said wafer, reducing the time and cost of making them and increasing the profitability of the process.

For the purposes of the present description, the term "wafer" refers to a thin slice of semiconductor material on which, according to processes known to one skilled in the art, a plurality of semiconductor devices is fabricated, such as IGBT, MOSFET and/or FRD devices, for example made in SiC, Si and/or GaN technology. Normally said wafers have a discoidal shape. Essentially, the shape of such a wafer depends on the method and process of growing the crystals of semiconductor material on which the electronic devices may be made.

In a possible embodiment of the safety system 3, said safety system 3 is comprised in an assembly comprising a needle probe card 2 and a safety system 3 according to the present invention. Thus, said safety system 3, in one possible embodiment thereof, could be made in conjunction with a needle probe card 2 in order to then be connected, as a single device, to a test machine 1. Such an embodiment allows the assembly to be connected directly to an already known test machine 1, without having to make changes to the test machine 1 in order to support said safety system 3.

More generally, a test machine 1 is a machine capable of performing high-voltage, high-current testing of power semiconductor electronic devices, e.g., IGBTs, MOSFETs, and/or FRDs. For the purposes of this description, the term "high-voltage and high-current test" means a functional test to be performed on a device under test DUT, specifically a power semiconductor electronic device, to evaluate its operation, performance and/or static and/or dynamic parameters at high voltages and high currents.

More generally, the test machine 1 according to the present invention is connectable to a needle probe card 2 to perform high-voltage and high-current testing on a single device under test DUT at a time.

The test machine 1 according to the present invention comprises a support structure 22. Said support structure 22 is adapted to house one or more devices under test DUT. Said support structure 22 in turn includes a moving system 220 for moving one or more devices under test DUT, in particular by moving said support structure 22 on which said one or more devices under test DUT are housed, to properly place a single device under test DUT at a time in contact with a plurality of needles N comprised in the needle probe card 2.

The test machine 1 according to the present invention is designed whereby between said needle probe card 2 and said test machine 1 a safety system 3 according to the present invention is interposed electronically.

In a possible embodiment, by way of non-limiting example, said test machine 1 comprises said safety system 3. In such an embodiment, the safety system 3 is already incorporated into the test machine 1 to which said needle probe card 2 may be connected.

FIG. 1 shows in a perspective view a test machine 1 including a needle probe card 2 and a safety system 3 for said needle probe card 2. From FIG. 1, it is apparent how said safety system 3 is interposed between the test machine 1 and said needle probe card 2. In FIG. 1 an embodiment is shown in which below said needle probe card 2 is positioned said support structure 22, which is adapted to house one or more devices under test DUT to place them one at a time in contact with the needles N of the needle probe card 2 so as to perform one or more tests on said device under test DUT.

More generally, the present invention further relates to a method for verifying the proper contact of the needles N comprised in a needle probe card 2 for a test machine 1 on a device under test DUT.

A possible embodiment of the method for verifying the correct contact according to the present invention comprises the following, preferably consecutive, steps:
providing a test machine 1 comprising a support structure 22 adapted to move at least one device under test DUT via a moving system 220;
providing at least one needle probe card 2;
providing a safety system 3 according to the present invention;
interfacing said moving system 220 with said safety system 3;
sending a check start signal to said safety system 3;
verifying the possibility of doing the check;
sending a motion start signal, issued by said safety system 3, to said moving system 220 of the support structure 22;
starting the motion of said support structure 22 thereby bringing the device under test DUT close to said needles N of said needle probe card 2;
verifying, in each needle N, that the current is flowing toward said device under test DUT;
continuing the motion of said support structure 22 until a current may flow in all the needles N comprised in the needle probe card 2;
sending a signal to the test machine 1 to indicate that the needle probe card 2 is ready to safely begin a test on a device under test DUT.

The method according to the present invention makes it possible to verify the correct contact of all the needles N in a needle probe card 2 on said device under test DUT, increasing safety, reducing the risk of damage to said device under test DUT and/or to the needle probe card 2 and/or to the support structure 22. The present method prevents the current from being spread over a smaller number of needles N, reducing the risk of damage to the device under test DUT, the needle probe card 2, and/or the support structure 22.

Preferably, the steps of providing and interfacing will not be described further because they are familiar to a person skilled in the art and apparent in light of the previous description.

The step of sending a check start signal is for example carried out by the moving system 220, which transmits an electronic signal, for example in TTL technology, to said safety system 3, for example to said control unit 32.

The step of verifying the possibility of doing the check is preferably the exchange of one or more signals, for example a handshake procedure, between the moving system 220 and the safety system 3, for example to said control unit 32, to verify that both the safety system 3 and said moving system 220 are able to operate correctly, in order to place all the needles N of the needle probe card 2 in contact with the device under test DUT.

The step of sending a motion start signal is preferably performed following the verification step described above. Normally, the motion start step is a signal transmitted from the safety system 3, and in particular from the control unit 32, to said moving system 220. Following the receipt of such a signal, the moving system 220 will begin moving the support structure 22.

The motion start step of said support structure 22 is performed by said moving system 220 in order to move the device under test DUT closer to the needles N.

The step of verifying the current flow in each needle N is performed via the safety system 3, for example by means of the current meters 323 and the processing unit 321, said processing unit communicating with said control unit 32.

The step of continuing the motion of said support structure 22 is a recursive check step, wherein said moving system 220 will continue the motion of said support structure 22 until said safety system 3 detects the correct contact of all the needles N on said device under test DUT.

Preferably, said recursive step has an additional sub-step of verifying that a limit stop has been reached. In effect, if the safety system 3 does not detect the contact of all the needles N but a maximum travel of said support structure 22 has been reached, an error signal will be emitted, for example by the same moving system 220 and directed to said test machine 1. In effect, said support structure 22 will not be able to continue further in its travel or it could cause damage to the needles N already in contact with the device under test DUT, to said probe card 2, and/or to the device under test DUT. The error signal allows the causes of the non-contact of all the needles N to be verified before starting a test on the device under test DUT.

The step of sending a signal to the test machine 1 is preferably carried out by means of the moving system 220, allowing a test on the device under test DUT to be started only when it is certain that all the needles N are in contact with said device under test DUT, the check being performed by means of said safety system 3.

FIG. 5A shows a block diagram denoting signals exchanged between the safety system 3 and the moving system 220 of the support structure 22 in a possible embodiment. From the figure it is apparent how the moving system 220 is able to transmit a check request signal C-Req, through which the check step begins, and after which the safety system 3 verifies the possibility of performing tests on a semiconductor device. Preferably, the safety system 3 sends a "ready" signal to the same moving system 220 to indicate that it is ready, e.g., prior to receipt of the check request signal C-Req to indicate that said safety system is active, or after the C-Req signal to indicate that it may begin a test procedure on a device under test DUT.

The safety system 3 also sends the "Open check" and "Close check" signals, preferably such signals being the result of an automatic check on the opening and closing switching devices 34 respectively of said switching devices 34.

From FIG. 5A, it is apparent that the safety system 3 also sends at least two further signals to the moving system, in particular at least one "K-1st" signal related to the detection of the first needle N in contact with the device under test DUT via the safety system 3, and at least one "K-all" signal related to the detection of all the needles N in contact with the device under test DUT via the safety system 3. These signals, alternatively, could be as many as the number of needles N and refer to each of the needles N on the needle probe card 2.

Preferably, both of the safety system 3 and the test machine 1 are designed as servers for controlling the moving system 220.

FIG. 5B, on the other hand, shows a comparison of the waveforms of the various signals exchanged between the safety system 3 and the moving system 220 as the position of the support structure 22 changes.

In effect, starting from top to bottom, the waves of the following signals are shown:
check request C-Req or test start signal;
Open check;
Close check;
K-1st signal
K-all signal.

Below these electronic signals, shown in the form of waves, is shown the trend of travel completed by the support structure 22 moved by the moving system 220.

Analyzing the time waves, it is apparent that after the switching of the C-Req signal, preferably switching to a high logic state, within a time interval less than or equal to 5 msec, the Close check and Open check signals also switch, preferably both switching to a high logic state. This time period ends with the switching of the Open check signal. During this time period, the K-1 st and K-all signals also switch, preferably assuming a low logic state, for example because the safety system 3 determines that none of the needles N are in contact with the device under test DUT. The safety system 3 has thus performed a check on its correct operation.

After this transient period, the moving system 220 begins moving the support structure 22, preferably moving it with a uniform motion.

With the start of the motion of the support structure 22, a contact search step begins, wherein the C-Req, Close check, and Open check signals remain in the same logic state, e.g., the high logic state, and await the stable switching of the K-1st and/or K-all signals, preferably to the high logic state.

With the switching of both K-1st and K-all signals, the safety system 3 has verified that all needles N on the needle probe card 2 are in proper contact.

Preferably, following the switching of both K-1st and K-all signals, the motion of the support structure 22 continues in such a way that an overtravel is completed. Such overtravel is such as to ensure that all the needles N generate a predetermined minimum force on the device under test DUT, so that even in the event of inadvertent motion of the needle probe card 2, the needles N, the support structure 22, and/or the device under test DUT, said needles N maintain sufficient contact to safely perform the test on said device under test DUT, such a solution being particularly useful for cantilever needle probe cards 2.

The support structure 22 having reached the appropriate position, the switching of the various signals to a different logic state, preferably the low one, begins, starting with the C-Req signal and subsequently also the Close check, Open check, K-1st and K-all signals. This transient switching period is less than or equal to 5 msec. After such switches, the needle card 2, the support structure 22 and the test machine 1 may begin one or more tests on the device under test DUT.

FIG. 5B shows, at the far right of the time plot, a possible switch of the K-1st and K-all signals. Such switch is to indicate the occurrence of an abnormality, such as a loss of contact of one or more of the needles N and/or an overcurrent flowing in one or more of said needles N and/or the opening of a switching device 34 associated with a needle N. By switching such signals, the safety system 3 is able to signal to the moving system 220 and to the test machine 1 that the safety system has interrupted the current flow in one or more needles N, preferably all of them, in order to safeguard the needle probe card 2, the support structure 22, and/or the device under test DUT. The moving system 220 detecting said switch allows the test on the device under test DUT via the test machine 1 to be stopped, and if necessary, to move the support structure 22 again to remove the device under test DUT.

The safety system 3 according to the present invention is therefore particularly suitable for application to test machines 1 capable of performing high-voltage, high-current testing for evaluating and/or verifying one or more static parameters and/or one or more dynamic parameters on semiconductor devices, preferably power devices, such as IGBTs, MOSFERs and/or FRDs, preferably of SiC, Si or GaN technology.

The safety system 3 according to the present invention may be used on various test machines 1 and operates both in tests wherein the device under test DUT is already placed on a dedicated substrate or "die" and if said device under test DUT is still incorporated in a semiconductor wafer, thus surrounded by other similar electronic devices.

The safety system 3, according to the present invention, makes it possible to significantly prolong the useful life of the needles N of a probe card 2, the probe card 2 itself, and/or the support structure 22 on which one or more devices under test DUT are housed, since the risk of the persistence of short circuits through said device under test DUT and/or overcurrents that could uncontrollably overheat and damage the device under test DUT and the support structure 22 is significantly reduced. In particular, it allows damage to the needles N of a probe card 2, the probe card 2 itself, and the support structure 22 to be prevented, particularly in the event wherein, during a test, the device under test DUT becomes damaged and breaks, for example, creating a short circuit. The safety system 3 is capable of quickly interrupting the current that would flow through the damaged device under test DUT, discharging onto the support structure 22, thereby preventing damage to said support structure 22. In effect, the safety system 3 according to the present invention makes it possible to prevent irreparable damage to the support structure 22, for example due to an unwanted short circuit in a portion of the device under test DUT which could discharge directly onto the support structure 22, melting and damaging and/or degrading it particularly rapidly. In effect, it is known that damage to the support structure 22 would cause prolonged interruption of the automated procedure of a plurality of tests on said devices under test DUT, making it necessary to replace said support structure 22.

The safety system 3 according to the present invention, comprising a plurality of switching devices 34, each capable of selectively interrupting the flow of current in the corresponding needle N, allows the current to the device under test DUT to be extinguished quickly, in particular faster than with solutions comprising current limiting systems with bypass circuits.

The safety system 3 according to the present invention, comprising a plurality of switching devices 34, enables high levels of safety to be ensured for the device under test DUT, the needle probe card 2 and the support structure 22, while still allowing high-voltage and high-current testing to be performed to evaluate and/or verify the dynamic parameters of the device under test DUT, even if said devices under test DUT are made in SiC, Si and/or GaN technology. This result would not be achievable through the implementation of solutions comprising current limiting systems with bypass circuits.

The safety system 3 according to the present invention allows the test to be interrupted and the current to the needle probe card 2 to be completely blocked even if the current exceeds a predetermined threshold in a single needle N. For example, it makes it possible to prevent a current flowing in each individual needle that exceeds a safety threshold, even if the total sum of currents on all the needles N does not exceed the safety threshold.

The safety system 3, according to the present invention, allows a check on each individual needle N to be performed and thus to verify its correct contact on the device under test DUT.

The safety system 3 according to the present invention may be implemented and designed for different types of tests to be performed on various power semiconductor electronic devices, such as IGBTs, MOSFETs and FRDs, preferably in SiC, Si and/or GaN technology.

Alternative embodiments not described or illustrated in this patent application, which are obvious from the contents of this patent application, are to be considered within the scope of protection of the present invention.

REFERENCE NUMBERS

Test machine 1
Dummy test card 14
Bypass test card 16
Needle probe card 2
Support structure 22
Moving system 220
Safety system 3
Control unit 32
Processing unit 321
Current meters 323
Switching devices 34
Impedance adapter 35
Device under test DUT
Load L
Needles N

The invention claimed is:

1. A safety system for a needle probe card for test machines for high-voltage and high-current testing of power semiconductor electronic devices;
    said needle probe card comprising a plurality of needles adapted to be placed in contact with a device under test (DUT), each needle of said plurality of needles being configured to allow a flow of an electric current;
    said safety system comprising:
    a control unit capable of determining the electric current flowing in every single needle;
    a plurality of switching devices configured to selectively interrupt the electric current flowing in said needles;
    at least one switching device of the plurality of switching devices being associated with each needle of said needle probe card;
    said control unit being configured to drive every single switching device to selectively interrupt the flow of the electric current in a corresponding needle.

2. The safety system of claim 1, wherein said control unit comprises:
    at least one processing unit; and
    a plurality of current meters;
    at least one current meter of the plurality of current meters is associated with each needle of said needle probe card; and
    the electric current measured by each current meter is sent to and/or received by said at least one processing unit.

3. The safety system of claim 2, wherein said control unit is configured to determine an average current value based on the electric current measured by said plurality of current meters at an instant of current measurement; and
    wherein said control unit is further configured, by driving said switching devices, to interrupt the electric current flowing through said plurality of needles when at least one current meter measures a current greater or smaller than said average current value by at least one predetermined current deviation threshold value.

4. The safety system of claim 1, comprising a plurality of voltage meters configured to measure respective voltage values at predetermined electrical connection terminals arranged in said DUT;
    wherein said control unit is configured to determine an average voltage value based on the voltage values measured by said plurality of voltage meters at an instant of voltage measurement; and
    wherein said control unit is further configured, by driving said switching devices, to interrupt the electric current flowing through said plurality of needles when at least one voltage meter of the plurality of voltage meters measures a voltage value greater or smaller than said average voltage value by at least one predetermined voltage deviation threshold value.

5. The safety system of claim 1, wherein said control unit is connectable to a dummy test card and/or to a bypass test card for the purpose of safeguarding the DUT during execution of tests and in the event of malfunctions.

6. The safety system of claim 1, wherein said control unit is interfaced with a moving system of a support structure;
    said control unit being adapted to contribute to driving said moving system for the purpose of moving said support structure appropriately, ensuring that all the needles of the needle probe card are in contact with a single DUT.

7. The safety system of claim 1, wherein said safety system is designed for needle probe cards for test machines operating on one single DUT at a time, for execution of high-voltage and high-current tests aimed at evaluating and/or verifying static and/or dynamic parameters of the single DUT.

8. The safety system of claim 1, wherein said safety system is designed to operate on one single DUT at a time, the single DUT being placed on a support configured to house said single DUT, or to operate on DUTs, one at a time, when said DUTs are still incorporated in a wafer of semiconductor material.

9. The safety system of claim 1, comprising an impedance adapter configured to reduce parasitic inductance during execution of tests on the DUT.

10. The safety system of claim 1, wherein the switching devices of said plurality of switching devices are power semiconductor devices.

11. An assembly comprising a needle probe card and a safety system, wherein said safety system is a safety system according to claim 1.

12. A test machine for high-voltage and high-current testing of power semiconductor electronic devices
a needle probe card being connectable to said test machine to execute high-voltage and high-current tests on one device under test (DUT) at a time;
said test machine comprising a support structure configured to house one or more DUTs;
said support structure comprising a moving system configured to move one or more DUTs to appropriately place one DUT at a time in contact with a plurality of needles comprised in the needle probe card;
wherein a safety system according to claim 1 is electronically interposed between said test machine and said needle probe card.

13. A method for verifying correct contact of needles, comprised in a needle probe card comprised in a test machine, on a device under test (DUT), said method comprising:
providing a test machine comprising a support structure, configured to move at least one DUT via a moving system;
providing a needle probe card;
providing a safety system according to claim 1;
interfacing said moving system with said safety system;
sending a check start signal to the safety system;
verifying possibility of doing a check;
sending a motion start signal, issued by said safety system, to said moving system of the support structure;
starting motion of said support structure, thereby bringing the DUT close to said needles of said needle probe card;
verifying in each needle that current is flowing towards said DUT;
continuing the motion of said support structure until current flows in all the needles comprised in the needle probe card; and
sending a signal to the test machine to indicate that the needle probe card is ready to safely begin a test on a DUT.

14. The safety system of claim 1, wherein the power semiconductor electronic devices are insulated gate bipolar transistors (IGBTs), metal-oxide-semiconductor field-effect transistors (MOSFETs), and fast recovery diodes (FRDs).

* * * * *